United States Patent
Furuya et al.

(10) Patent No.: US 9,075,943 B2
(45) Date of Patent: Jul. 7, 2015

(54) MESH NUMBER PREDICTION METHOD, ANALYZING APPARATUS AND COMPUTER-READABLE STORAGE MEDIUM

(75) Inventors: Sachiko Furuya, Kawasaki (JP); Makoto Sakairi, Kawasaki (JP); Akihiko Fujisaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 668 days.

(21) Appl. No.: 13/421,085

(22) Filed: Mar. 15, 2012

(65) Prior Publication Data
US 2012/0239359 A1    Sep. 20, 2012

(30) Foreign Application Priority Data
Mar. 17, 2011    (JP) .................. 2011-059768

(51) Int. Cl.
G06F 7/60      (2006.01)
G06F 17/10     (2006.01)
G06F 17/50     (2006.01)

(52) U.S. Cl.
CPC .................. G06F 17/5018 (2013.01)

(58) Field of Classification Search
USPC ........................................... 703/2
See application file for complete search history.

(56) References Cited

U.S. PATENT DOCUMENTS 6,301,192 B1 * 10/2001 Reise .................. 367/11
7,304,642 B2    12/2007 Kataoka et al.

FOREIGN PATENT DOCUMENTS

| JP | 5-020297 | 1/1993 |
| JP | 5-120385 | 5/1993 |
| JP | 9-128373 | 5/1997 |
| JP | 2005-301349 | 10/2005 |
| JP | 2008-015636 | 1/2008 |

* cited by examiner

*Primary Examiner* — Saif Alhija
(74) *Attorney, Agent, or Firm* — Fujitsu Patent Center

(57) ABSTRACT

A mesh number prediction method obtains a mesh length for a case in which a mesh having an arbitrary shape is created by approximating an entire analyzing target by a three-dimensional (3D) mesh model based on data of a 3D surface model of the analyzing target, obtains a mesh number of each part forming the analyzing target for a case in which a mesh having an arbitrary shape is created by approximating each part by a 3D mesh model based on the mesh length, and obtains a predicted total mesh number of the entire analyzing target from a ratio of volumes of the entire analyzing target and each part based on the mesh number.

20 Claims, 13 Drawing Sheets

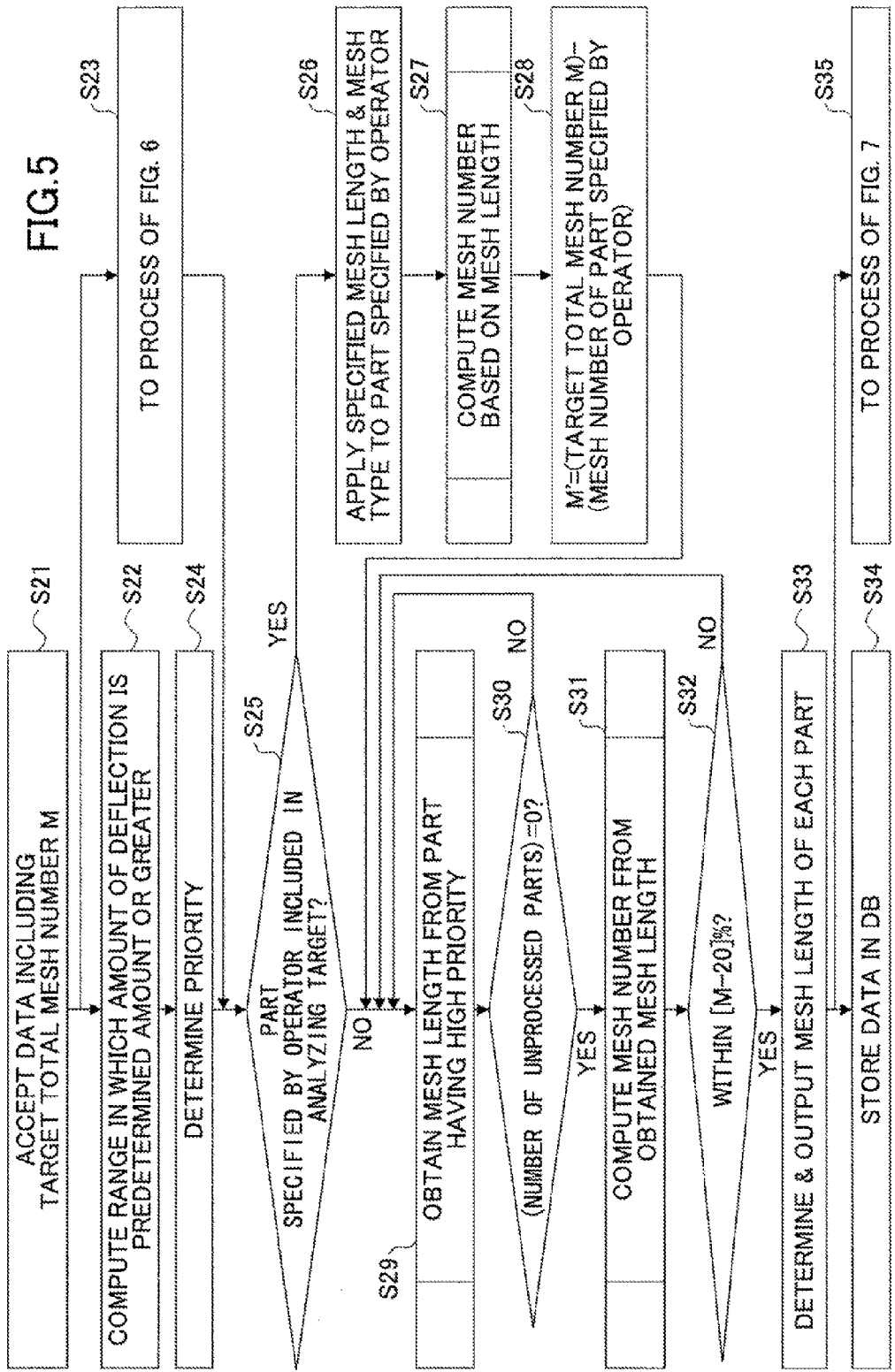

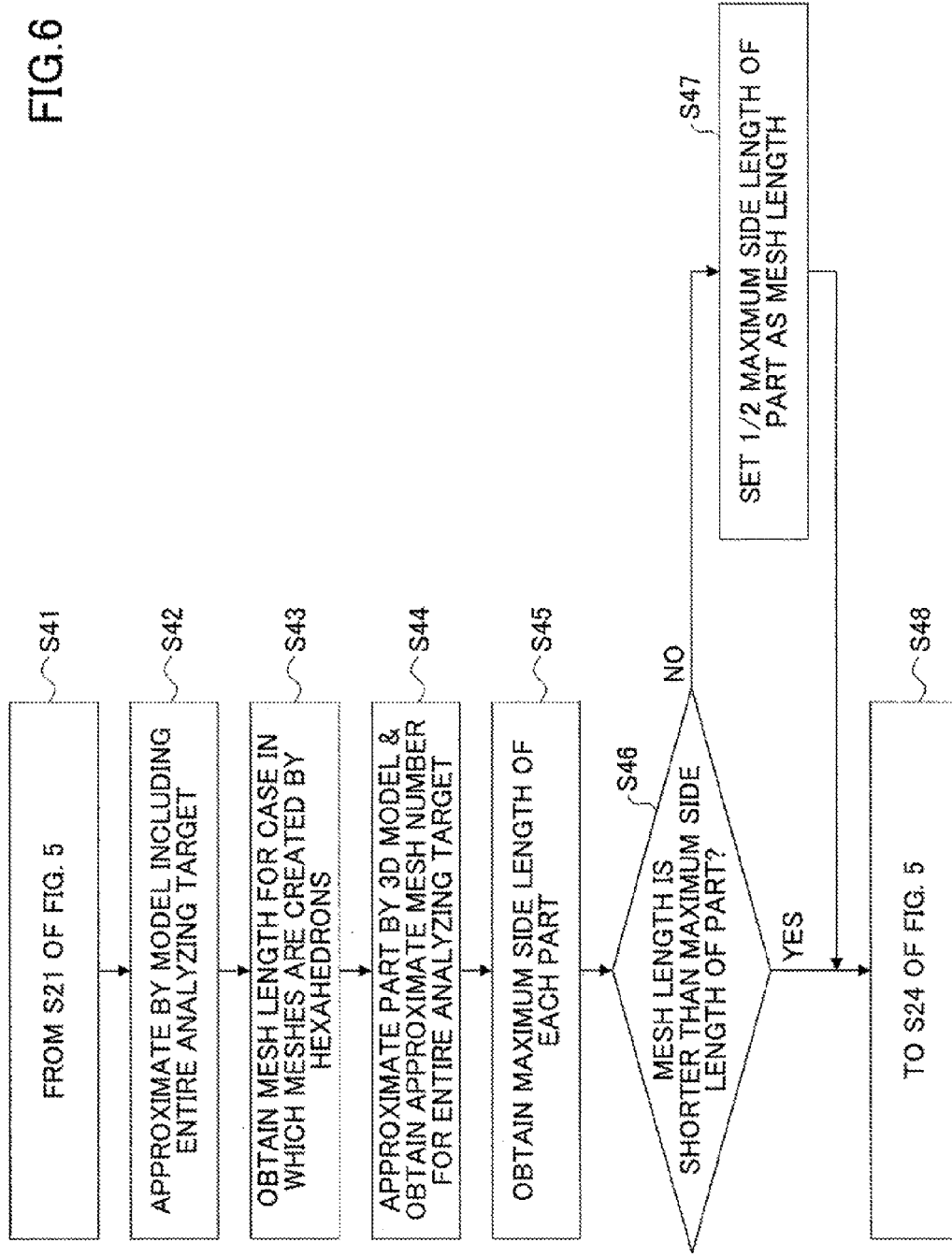

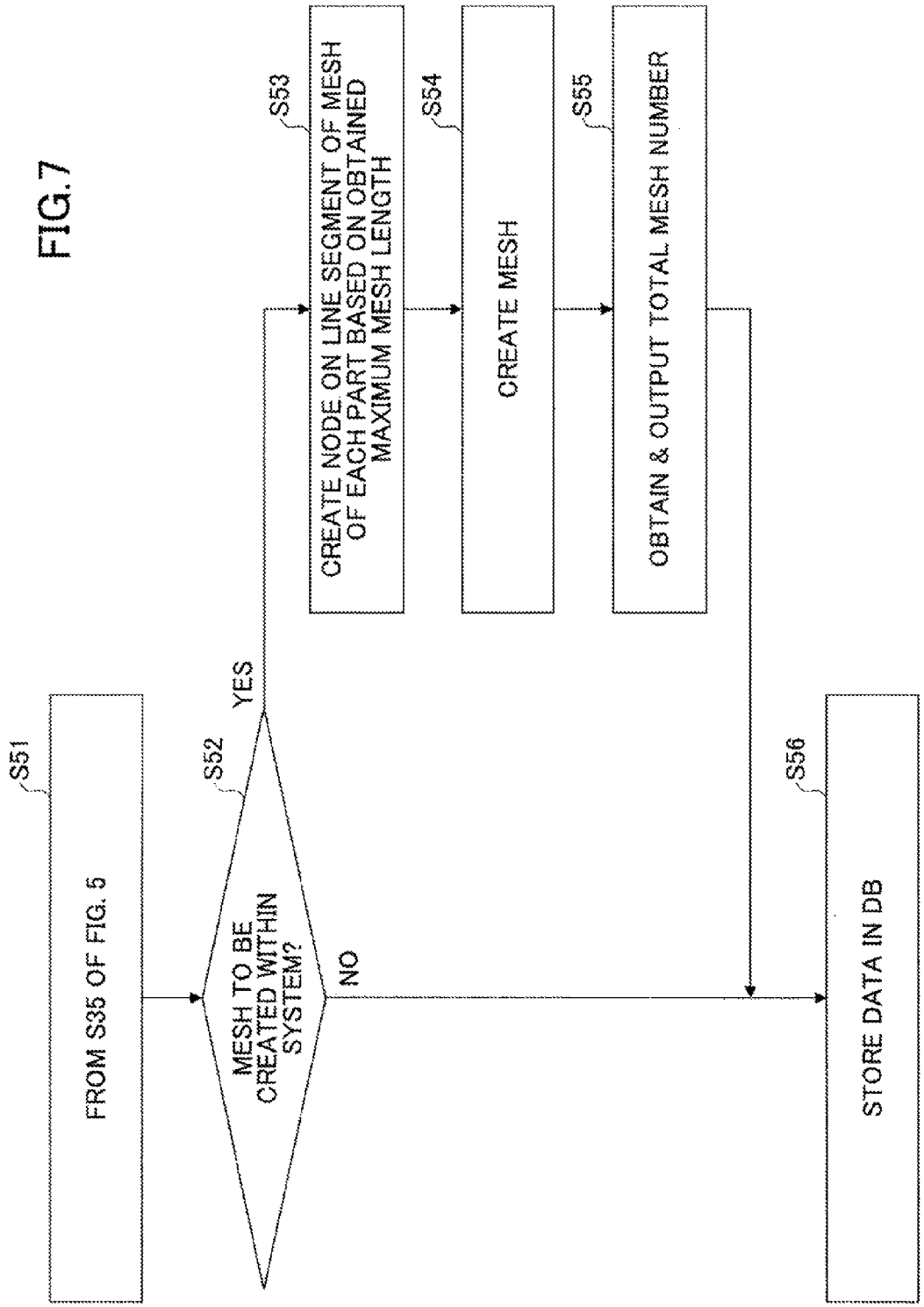

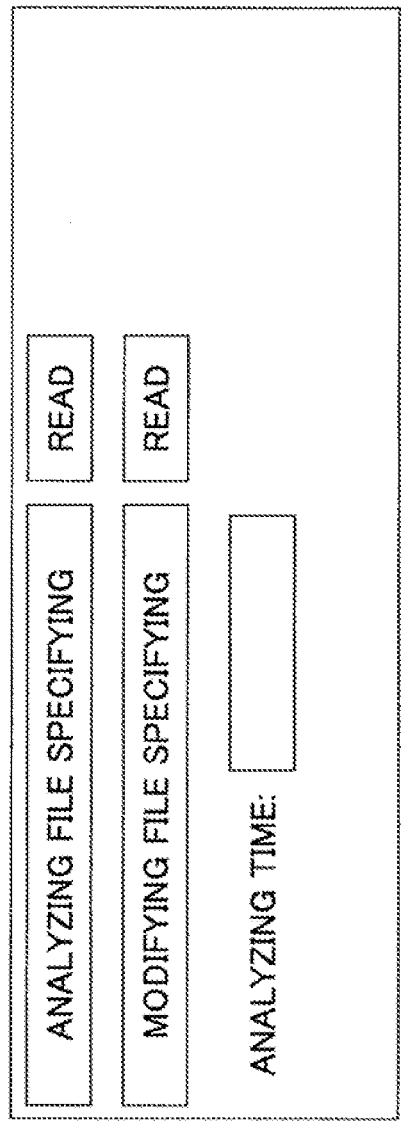

US 9,075,943 B2

MESH NUMBER PREDICTION METHOD, ANALYZING APPARATUS AND COMPUTER-READABLE STORAGE MEDIUM

CROSS-REFERENCE TO RELATED APPLICATIONS

This application is based upon and claims the benefit of priority of the prior Japanese Patent Application No. 2011-059768, filed on Mar. 17, 2011, the entire contents of which are incorporated herein by reference.

FIELD

The present invention relates to a mesh number prediction method, an analyzing apparatus, and a computer-readable storage medium, which are suited for a CAE (Computer Aided Engineering) system that simulates characteristics of an analyzing target by numerical analysis.

BACKGROUND

The CAE system numerically simulates characteristics or physical phenomena of the analyzing target, such as a circuit board assembly mounted with a plurality of parts, and an electronic apparatus formed by a plurality of parts, by numerical analysis. The characteristic of the analyzing target may include mechanical characteristics, electrical characteristics, thermal characteristics, and the like of the analyzing target. For example, a structural analysis of the analyzing target may include an analysis of mechanical characteristics, such as a strength of the analyzing target with respect to a load. When analyzing the entire analyzing target, three-dimensional surface models are created with respect to each of the parts, and a finite element model of each part is created from each of the three-dimensional surface models according to the FEM (Finite Element Method) or the like. Material characteristics and contact conditions or boundary conditions with respect to other parts may be specified with respect to the finite element model, in order to numerically analyze the finite element model. When the designed mechanical characteristics, such as the designed strength, cannot be obtained as a result of the numerical analysis, the finite element model may be modified or, the finite element model may be created over again, before making the numerical analysis again.

When segmenting (or dividing) regions of the three-dimensional surface model of the analyzing target into partial regions, that is, elements, an element identification number is assigned to each element and a geometrical shape of the element is represented by coordinate values of nodes. A node identification number within the element is assigned to the node. For example, a mesh generation method (or mesh method) may be used to segment the region of the three-dimensional surface model into the elements. The mesh generation method segments the region of the three-dimensional surface model into elements called meshes, and creates the finite element model called a mesh model. When creating the mesh model, the numerical analysis may take time when the total number of meshes is large. On the other hand, when the total number of meshes is small, it may be difficult to perform an accurate numerical analysis. Hence, an operator conventionally determines the total number of meshes manually, depending on an analyzing environment in which the numerical analysis is performed, such as the performance of the analyzing apparatus or the required analyzing speed. For example, when the total number of meshes is excessively large with respect to the analyzing environment, the operator performs an operation to manually reduce the total number of meshes with respect to the part that does not greatly affect the numerical analysis. In addition, when it is judged from the result of the numerical analysis that an appropriate numerical analysis cannot be performed because the total number of meshes is too small, the operator performs an operation to manually increase the total number of meshes.

In the conventional CAE system, the optimization of the total number of meshes of the mesh model depends on the manual operation of the operator who performs the manual operation based on experience and the like. Consequently, the time it takes to optimize the total number of meshes may differ greatly depending on the individual operator, and it is difficult to predict the analyzing time that will be required to analyze the analyzing target. Furthermore, because the total number of meshes of the analyzing target is also adjusted depending on the analyzing environment or the analysis result, it is difficult to predict the analyzing time that will be required to analyze the analyzing target, even in the case of a relatively experienced operator, particularly when the analyzing target has never been analyzed in the past. For this reason, it is difficult to efficiently analyze the analyzing target without being dependent on the operator.

Because the conventional CAE system cannot predict the total number of meshes of the mesh model that is appropriate for analyzing the characteristics of the analyzing target, the operator needs to manually regenerate the meshes or manually increase or decrease the number of meshes depending on the analyzing conditions or the like. As a result, the load on the operator increases, and it takes time to adjust the number of meshes.

SUMMARY

Accordingly, it is an object in one aspect of the embodiment to provide a mesh number prediction method, an analyzing apparatus, and a non-transitory computer-readable storage medium, which may predict the number of meshes of a mesh model appropriate for analyzing characteristics of an analyzing target.

One aspect of the present invention may provide a mesh number prediction method to be implemented in a computer, including obtaining a mesh length for a case in which a mesh having an arbitrary shape is created by approximating an analyzing target in its entirety by a three-dimensional mesh model, based on data of a three-dimensional surface model of the analyzing target; obtaining a mesh number of each of parts forming the analyzing target for a case in which a mesh having an arbitrary shape is created by approximating each of the parts by a three-dimensional mesh model, based on the mesh length; and obtaining a predicted total mesh number of the analyzing target in its entirety from a ratio of volumes by comparing a volume of the analyzing target in its entirety and a volume of each of the parts, based on the mesh number.

Another aspect of the present invention may provide an analyzing apparatus including a processor; and a storage unit coupled to the processor, wherein the processor includes a first unit configured to obtain and store in the storage unit a mesh length for a case in which a mesh having an arbitrary shape is created by approximating an analyzing target by a three-dimensional mesh model that includes the analyzing target in its entirety, based on data of a three-dimensional surface model of the analyzing target; a second unit configured to obtain and store in the storage unit a mesh number of each of parts forming the analyzing target for a case in which a mesh having an arbitrary shape is created by approximating each of the parts by a three-dimensional mesh model, based on the mesh length; a third unit configured to obtain and store in the storage unit a predicted total mesh number of the analyzing target in its entirety from a ratio of volumes by comparing a volume of the analyzing target in its entirety and a volume of each of the parts, based on the mesh number; and an analyzing unit configured to analyze the analyzing target using meshes created based on the predicted total mesh number.

Still another aspect of the present invention may provide a non-transitory computer-readable storage medium that stores a program which, when executed by a computer, causes the computer to perform a process including a procedure to obtain a mesh length for a case in which a mesh having an arbitrary shape is created by approximating an analyzing target by a three-dimensional mesh model that includes the analyzing target in its entirety, based on data of a three-dimensional surface model of the analyzing target; a procedure to obtain a mesh number of each of parts forming the analyzing target for a case in which a mesh having an arbitrary shape is created by approximating each of the parts by a three-dimensional mesh model, based on the mesh length; and a procedure to obtain a predicted total mesh number of the analyzing target in its entirety from a ratio of volumes by comparing a volume of the analyzing target in its entirety and a volume of each of the parts, based on the mesh number.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 5 is a flow chart for explaining an example of a mesh size determining process;

FIG. 6 is a flow chart for explaining a part of the analyzing process illustrated in FIG. 3;

FIG. 7 is a flow chart for explaining a part of the analyzing process illustrated in FIG. 3;

FIGS. 11A, 11B and 11C are diagrams for explaining examples of a display screen displayed on a display.

DESCRIPTION OF EMBODIMENTS

Preferred embodiments of the present invention will be described with reference to the accompanying drawings.

According to one aspect of the present invention, the mesh number prediction method, the analyzing apparatus, and the non-transitory computer-readable storage medium may obtain a mesh length for a case in which a mesh having an arbitrary shape is created by approximating the analyzing target in its entirety by a three-dimensional mesh model, based on data of a three-dimensional surface model of the analyzing target. In addition, based on the mesh length that is obtained, the number of meshes (or mesh number) of each part forming the analyzing target may be obtained for a case in which a mesh having an arbitrary shape is created by approximating each part by the three-dimensional mesh model. A predicted total number of meshes (or total mesh number) of the entire analyzing target may be obtained based on the mesh number of each part, from a ratio of volumes by comparing the volume of the entire analyzing target and the volume of each part.

A description will now be given of the mesh number prediction method, the analyzing apparatus, and the non-transitory computer-readable storage medium in each embodiment according to the present invention.

[First Embodiment]

Figure 1:
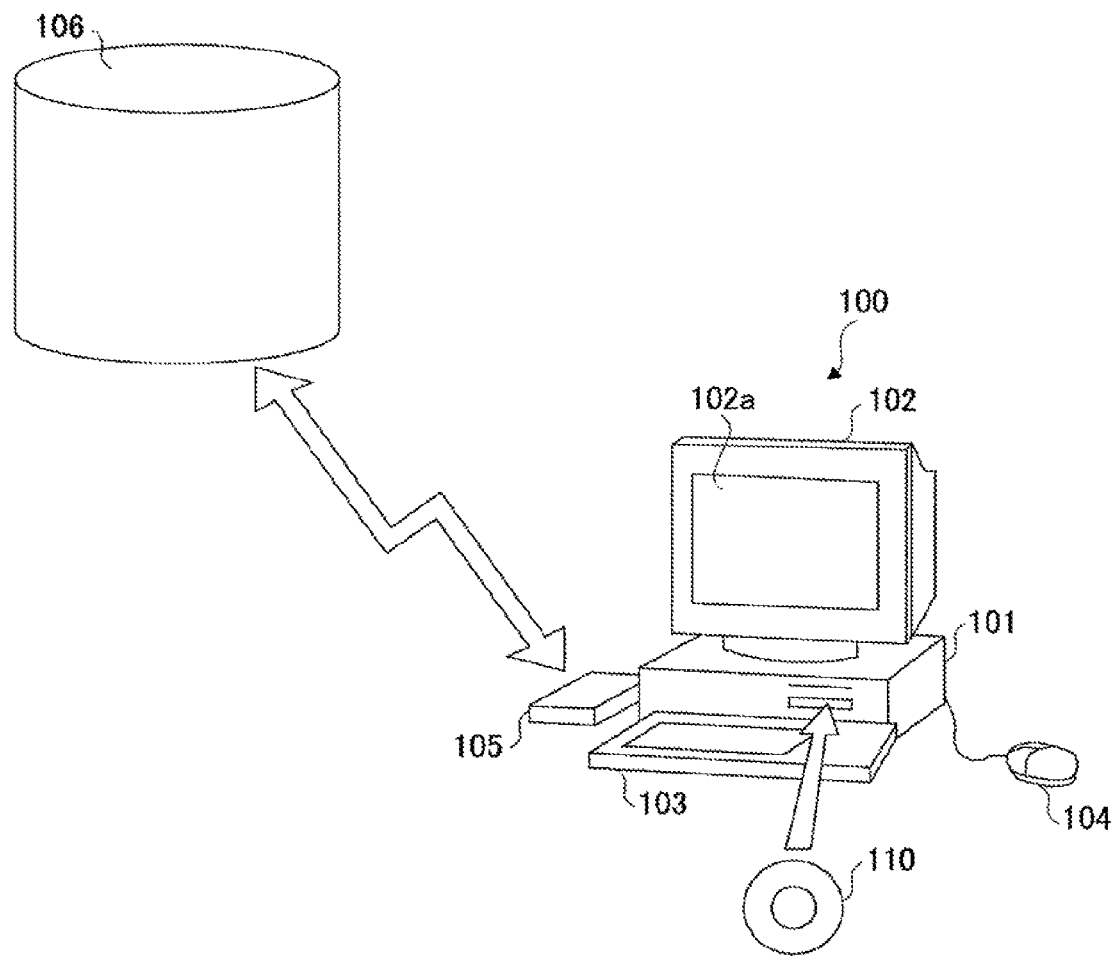
FIG. 1 is a perspective view illustrating an example of a computer system in a first embodiment of the present invention.

FIG. 1 is a perspective view illustrating an example of a computer system in a first embodiment of the present invention. In this embodiment, the mesh number prediction method may cause a computer to execute procedures of a program in order to make the computer function as units or means of the analyzing apparatus. Alternatively, the program which, when executed by the computer, causes the computer to perform a process in order to make the computer realize functions of the analyzing apparatus, may be stored in the non-transitory computer-readable storage medium. In this example, it is assumed for the sake of convenience that the mesh number prediction method is applied to a CAE (Computer Aided Engineering) system which numerically simulates characteristics or physical phenomena of the analyzing target, such as a circuit board assembly mounted with a plurality of parts, by numerical analysis.

A computer system 100 illustrated in FIG. 1 includes a main body 101, a display 102, a keyboard 103, a mouse 104, and a modem 105. The main body 101 may include a processor, such as a CPU (Central Processing Unit), and a storage unit, such as a disk drive, and the like. The display 102 may display an operation screen, a message with respect to an operator (or user), a result of the mesh number prediction, a result of the numerical analysis, and the like on a display screen 102a in response to an instruction from the main body 101. The keyboard 103 may be used by the operator to input various information to the computer system 100. The mouse 104 may be used by the operator to specify an arbitrary position on the display screen 102a of the display 102. The modem 105 may make an access to an external database or the like and download programs and the like stored in another computer system (not illustrated).

The program (mesh number predicting software or tool) which causes the computer system 100 to at least have a mesh number predicting function, may be stored in a portable recording medium such as a disk 110 or, may be downloaded from a recording medium 106 of another computer system using a communication unit such as the modem 105. The program is input to the computer system 100 and compiled therein. The program may operate the computer system 100 (that is, a CPU 201 which will be described later) as the analyzing apparatus (or simulation system) having the mesh number predicting function. The program may be stored in any suitable non-transitory computer-readable storage medium, such as the disk 110. The recording medium forming the non-transitory computer-readable storage medium is not limited to portable recording media such as the disk 110, IC card memories, magnetic disks including floppy (registered trademark) disks, magneto-optical disks and CD-ROMs. The recording medium forming the non-transitory computer-readable storage medium may include various recording media accessible by the computer system that is connectable to the computer system 100 via the communication unit or communication means such as the modem 105 and a LAN (Local Area Network).

Figure 2:
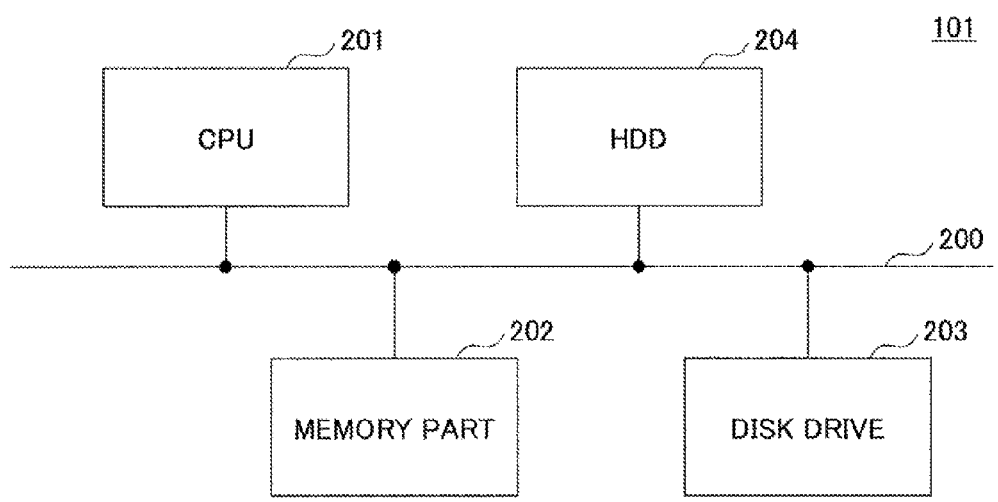
FIG. 2 is a block diagram for explaining an example of a structure of a main body of the computer system.

FIG. 2 is a block diagram for explaining an example of a structure of the main body 101 of the computer system 100. In FIG. 2, the main body 101 includes the CPU 201, a memory part 202, a disk drive 203, and a HDD (Hard Disk Drive) 204 that are connected via a bus 200. The memory part 202 may include a RAM (Random Access Memory), a ROM (Read Only Memory), and the like. The disk drive 203 is provided for the disk 110. In this embodiment, the display 102, the keyboard 103 and the mouse 104 are also connected to the CPU 201 via the bus 200, however, the display 102, the keyboard 103 and the mouse 104 may of course be connected directly to the CPU 201. In addition, the display 102 may be connected to the CPU 201 via a known graphic interface (not illustrated) that processes input and output image data.

In the computer system 100, at least one of the keyboard 103 and the mouse 104 may form an input unit (or input means) of the analyzing apparatus. The display 102 may form a display unit (or display means) to display the result of the mesh number prediction, the result of the numerical analysis, and the like on the display screen 102a. The CPU 201 may function at least as a mesh number predicting unit (or mesh number predicting means) to obtain the result of the mesh number prediction. The memory part 202, the disk drive 102, and the HDD 204 may individually or, by an arbitrary combination thereof, form a storage unit (or storage means) to store data and programs. The storage unit may form a DB (Data-Base) that includes a log of mesh creation.

Of course, the structure of the computer system 100 is not limited to the structure illustrated in FIGS. 1 and 2, and other known structures may be used instead.

Figure 3:
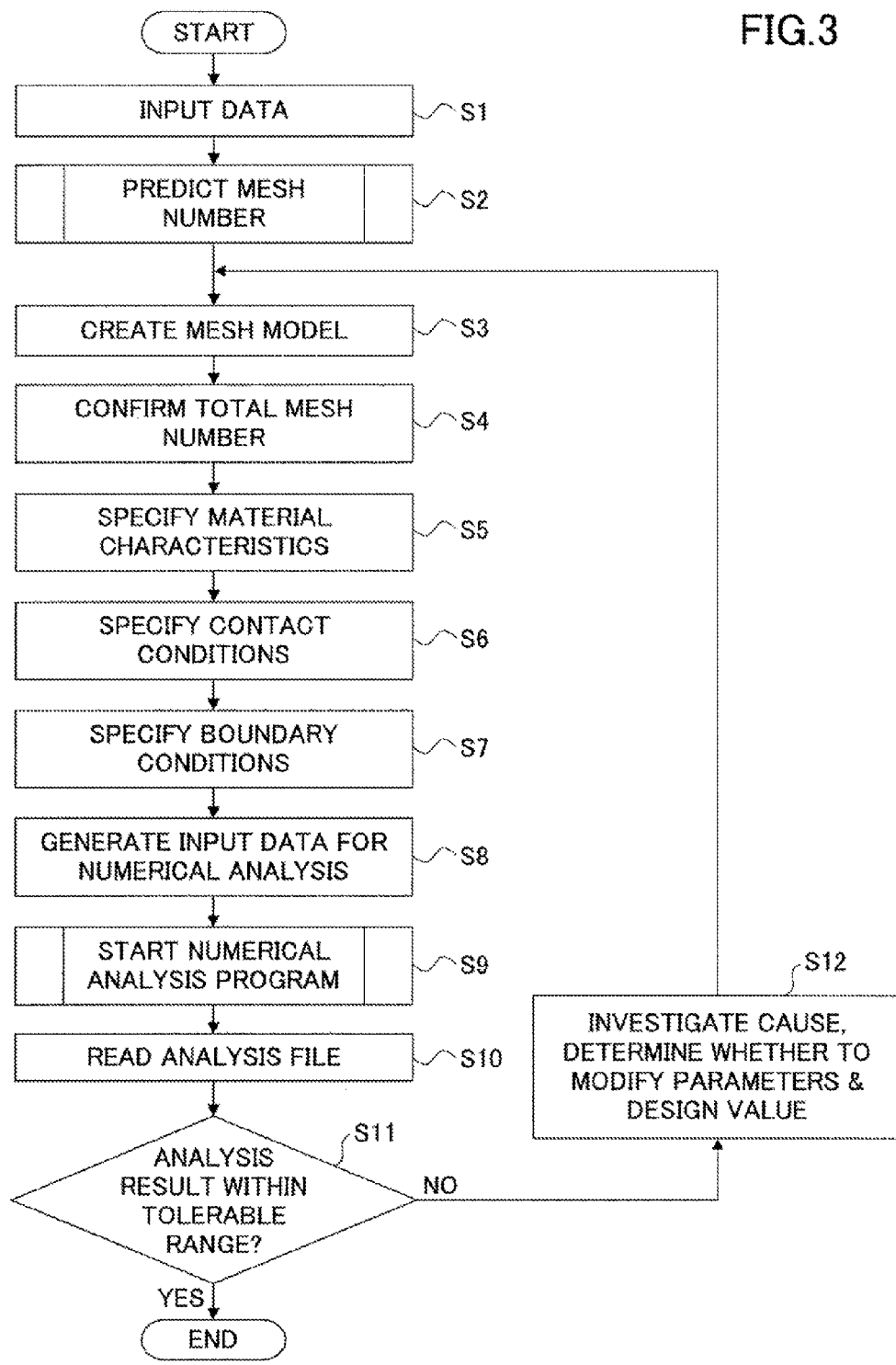
FIG. 3 is a flow chart for explaining an example of an analyzing process in the first embodiment.

FIG. 3 is a flow chart for explaining an example of an analyzing process in the first embodiment. Processes of steps S1 through S12 illustrated in FIG. 3 may be executed by the CPU 201 illustrated in FIG. 2, for example. When the analyzing process illustrated in FIG. 3 is started, the step S1 inputs data (for example, CAD (Computer Aided Design) data) of the three-dimensional surface model of the circuit board assembly from the storage unit or an external apparatus to the CPU 201, and accepts data, such as a target total number of meshes (or target total mesh number), input from the input unit by the operator. The step S2 predicts the number of meshes (or mesh number) according to procedures which will be described later, based on the data accepted in the step S1, including the data of the three-dimensional surface model. The step S3 creates the three-dimensional mesh model from the three-dimensional surface model using a known mesh creating method, based on the predicted mesh number. The three-dimensional mesh model may be created automatically by the CPU 201 or, created semi-automatically based on the data or instructions input from the input unit by the operator. The step S4 computes the total number of meshes (or total mesh number) of the three-dimensional mesh model that is created, and confirms whether the total mesh number falls within a tolerable range that is the target total mesh number or less. When the total mesh number does not fall within the tolerable range that is the target total mesh number or less, the CPU 201 automatically adjusts (that is, increases or decreases) the mesh segmenting number (or mesh division number) so that the total mesh number falls within the tolerable range that is the target total mesh number or less.

Because this adjustment of the mesh segmenting number is performed on a relatively small scale and not on a large scale such that the meshes are regenerated, an adjustment process may be performed automatically. By creating the three-dimensional mesh model from the three-dimensional surface model based on the predicted mesh number and confirming the total mesh number of the three-dimensional mesh model, it may be possible reduce a re-do process on a large scale, such as manually creating the meshes over again by the operator in order to adjust the total mesh number after the meshes are created.

The step S5 accepts material characteristics of the parts forming the circuit board assembly, specified from the input unit by the operator or, specified according to a default setting. The step S6 accepts contact conditions among the parts forming the circuit board assembly, specified from the input unit by the operator or, specified according to a default setting. The step S7 accepts boundary conditions among the parts forming the circuit board assembly, specified from the input unit by the operator or specified according to a default setting. The step S8 generates characteristics of the circuit board assembly, such as input data for numerical analysis for use in numerically analyzing a load applied on the parts, for example, according to a known method.

The step S9 starts a numerical analysis program and executes procedures of the numerical analysis program, based on the input data for the numerical analysis, and writes a result of the numerical analysis with respect to the three-dimensional mesh model into an analysis file within the storage unit. A known numerical analysis program may be used for the numerical analysis program, in order to analyze one of mechanical characteristics, electrical characteristics, thermal characteristics, and the like of the analyzing target, or an arbitrary combination of such characteristics of the analyzing target. The step S10 reads the analysis file from the storage unit. For example, the step S11 decides whether an analysis result of a strength of the analyzing target for a case in which the load is applied on the analyzing target falls within a tolerable range. When the analysis result falls within a predetermined range with respect to a designed value, a decision result in the step S11 becomes YES, and the process ends. On the other hand, when the decision result in the step S11 is NO, the cause of the analysis result falling outside the tolerable range is investigated by the operator in the step S12. In addition, the step S12 determines whether parameters, such as the material characteristics, the contact conditions, the boundary conditions and the like need to be modified, or the design value for the load and the like needs to be modified, based on inputs from the input unit made by the operator. After the step S12, the process returns to the step S3.

The following first function, second function, and third functions of the analyzing apparatus may be realized when the operator inputs data to the computer system 100, such as the CAD data of the three-dimensional surface model, the target total mesh number (or node number) M, the element type (or mesh type) to be used for the analysis, and the like of the analyzing target. The element type indicates the shape and the like of the element. The first function determines a maximum mesh length required for each part forming the analyzing target. The second function determines a priority of the mesh length, using a load position with respect to the analyzing target or the magnitude of the load, as a weight. The third function generates the mesh in addition to predicting the mesh length.

A format used by the CAD data of the three-dimensional surface model is not limited to a particular format. For example, the CAD data may have the format output by three-dimensional CAD design software, such as Pro/E (Pro/Engineer), CARIA (Computer graphics Aided Three dimensional Interactive Application), SolidWorks and the like, or have the format of an intermediate file such as STEP (STandard for the Exchange of Product model data), IGES (Initial Graphics Exchange Specification) and the like.

A description will be given of the first function. The CPU 201 approximates the entire analyzing target, that is, the entire circuit board assembly in this example, by the three-dimensional mesh model such as a rectangular parallelepiped, a cube, a cylinder and the like, based on the CAD data that are input. For example, the CPU 201 obtains the mesh length for the case in which the meshes of the circuit board assembly are created by hexahedrons. Next, the CPU 201 approximates each part mounted on a circuit board of the circuit board assembly by the three-dimensional mesh model such as the rectangular parallelepiped, the cube, the cylinder and the like, in a manner similar to the circuit board assembly, based on the mesh length of the entire three-dimensional mesh model. For example, the CPU 201 obtains the mesh number for the case in which the meshes of the part are created by hexahedrons. In addition, the CPU 201 compares a volume of the entire circuit board assembly and a volume of each part, and obtains an approximate mesh number of the entire circuit board assembly, that is, the predicted total mesh number, from the ratio of the volumes based on the mesh number of each part. When the mesh length obtained for the circuit board assembly is longer than a side of the part having a maximum length (hereinafter also referred to as "maximum side length" of the part), the CPU 201 sets the mesh length of the circuit boar assembly to ½ the maximum side length of the part. Further, the CPU 201 confirms whether the total mesh number obtained by totaling the mesh number of each of the parts is less than or equal to the target total mesh number M that is input from the input unit by the operator and falls within a tolerable range from the target total mesh number M. For example, when the mesh numbers on the order of [M-20]% is tolerated, the operator inputs the tolerable range of 20% to the computer system 100 from the input unit. When the tolerable range is not specified from the input unit by the operator, the computer system 100 may use a default value that is stored in the storage unit. Similarly, when the target total mesh number M is not specified from the input unit by the operator, the computer system 100 may use a default value that is stored in the storage unit. When the total mesh number exceeds the target total mesh number M, a message or the like urging the operator to improve the mesh length of the circuit board assembly may be displayed on the display unit. The mesh number of each part may be recomputed based on information that is input from the input unit by the operator in order to improve the mesh length. When the total mesh number is less than or equal to the target total mesh number M and falls within the tolerable range from the target total mesh number M, the CPU 201 confirms the mesh length that is given to each part and notifies the operator of the mesh length by displaying the mesh length on the display unit. The operator may create the mesh based on the mesh length that is obtained and confirmed.

Next, a description will be given of the second function. For example, in the case in which the load is applied on a portion of the circuit board assembly, the CPU 201 determines the mesh length by setting the priority higher for the parts closer to the load position, when the operator inputs the load position (that is, analyzing target position) where the load is applied and the magnitude of the load, in addition to the target total mesh number M, from the input unit. The CPU 201 performs a relatively fine mesh segmenting (or mesh segmentation) with respect to the parts that are located relatively close to the load position (that is, less than a predetermined distance from the load position) and where a stress gradient may be predicted to be relatively large. On the other hand, the CPU 201 performs a relatively coarse mesh segmenting with respect to the parts that are located relatively far from the load position (that is, the predetermined distance or more from the load position) and where the stress gradient may be predicted to be relatively small.

Figure 4A:
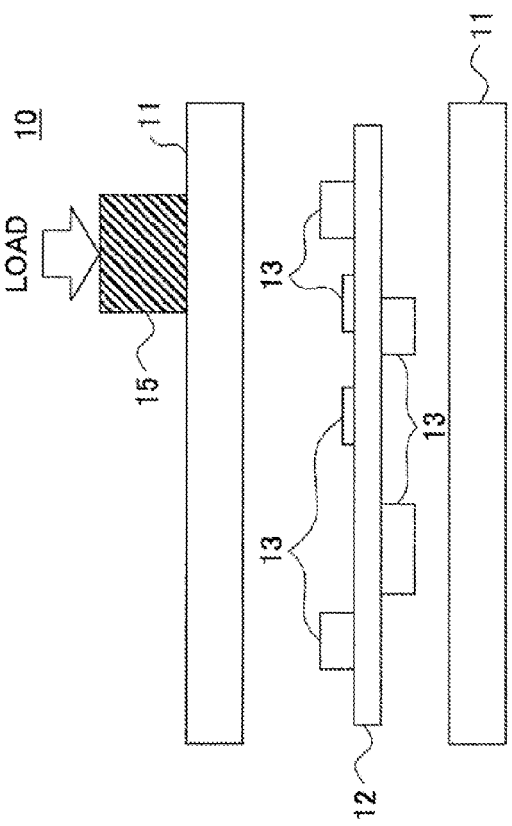
FIGS. 4A and 4B are diagrams illustrating an example of an analyzing target.
Figure 4B:
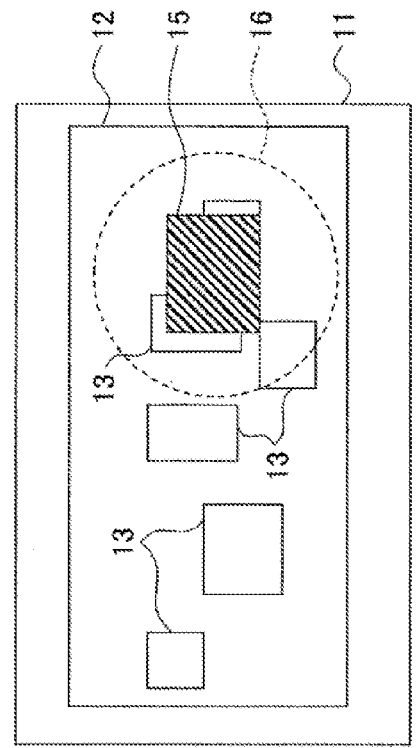

FIGS. 4A and 4B are diagrams illustrating an example of the analyzing target. FIG. 4A illustrates a side view of the circuit board assembly, and FIG. 4B illustrates a plan view of the circuit board assembly. A circuit board assembly 10 illustrated in FIGS. 4A and 4B includes a housing (or casing) 11, and a circuit board 12 provided within the housing 11. The circuit board assembly 10 may form an electronic apparatus, such as a portable telephone. A plurality of parts 13 are mounted on the circuit board 12. It is assumed for the sake of convenience that a load is applied in a direction indicated by an arrow in FIG. 4A at a load position 15 indicated by a hatching in FIGS. 4A and 4B.

For example, when the data (for example, CAD data) of the three-dimensional surface model of the circuit board assembly 10 illustrated in FIGS. 4A and 4B are input to the computer system 100, the CPU 201 determines the priority order for determining the maximum mesh length of the part 13 from a distance determined from a range that is determined by a deflection (or bend) caused by the load with respect to the part 13 and support at both ends, the load position 15, and a center of gravity of each part 13 on the circuit board 12, in order to assign the priority that determines the maximum mesh length from the part 13 having the shortest distance. For example, a value "1" is assigned as the priority to the part 13 having the highest priority. When the range in which the amount of deflection is a predetermined amount or greater is obtained as indicated by a dotted line 16 in FIG. 4B from a known computation formula that computes the deflection caused by the load and the support at both ends, the CPU 201 judges that a finest mesh segmenting that results in smallest meshes needs to be performed with respect to the part 13 that is located within the range 16 and has a minimum distance D between the load position 15 and the center of gravity of this part 13, among all of the parts 13. An output of the CPU 201 indicates the maximum mesh length required for each of the parts 13, and this output may be displayed on the display unit. The range 16 that is determined by the deflection is not limited to a circular region illustrated in FIG. 4B, and may be set to a region having an arbitrary shape including a rectangular shape and an oval shape.

A positional relationship of the load position 15 and the part 13 may be determined by whether the part 13 is located within the range 16 and by the distance D between the load position 15 and the center of gravity of the part 13. The parts 13 may be numbered using the priority that is determined from information indicating this positional relationship, in order to determine the mesh length from the part 13 having the highest priority.

In a case in which the maximum side length of the part 13 having the highest priority is segmented into 10 segments, for example, the maximum mesh length is determined by outputting the maximum mesh length for this case from the CPU 201. When the segmenting number of the maximum side length of the part 13 having the highest priority is regarded as having a ratio 1, coefficients such as 0.8, 0.7, . . . may be multiplied to the ratio as the priority of the parts 13 decreases, so that the segmenting number decreases and the meshes become more coarse for the parts 13 having lower priorities.

In this example, each part 13 is segmented at least once, and the segmenting method may be specified from the input unit by the operator in order to make the segmenting at equal intervals or equal ratio intervals.

Next, the CPU 201 adds the priority as the weight to the mesh length that is obtained by the first function described above, and computes the total mesh number. The mesh number is automatically increased when the total mesh number that is computed is less than the tolerable range that is the target total mesh number M or less. The mesh number may be increased according to a method specified from the input unit by the operator. The specified method may increase the mesh segmenting number of the parts 13 starting from the part 13 having the high priority or, increase the mesh segmenting number of the parts 13 starting from the part 13 having the low priority or, increase the mesh segmenting number of the parts 13 as a whole regardless of the priority or, increase the mesh segmenting number of the parts 13 according to other rules. In addition, a default mesh segmenting method stored in the storage unit of the computer system 100 may be used when the method of increasing the mesh number is not specified.

On the other hand, the mesh number is automatically decreased when the total mesh number that is computed exceeds the target total mesh number M. The mesh number may be decreased according to a method specified from the input unit by the operator. The specified method may decrease the mesh segmenting number of the parts 13 starting from the part 13 having the high priority or, decrease the mesh segmenting number of the parts 13 starting from the part 13 having the low priority or, decrease the mesh segmenting number of the parts 13 as a whole regardless of the priority or, decrease the mesh segmenting number of the parts 13 according to other rules. In addition, a default mesh segmenting method stored in the storage unit of the computer system 100 may be used when the method of decreasing the mesh number is not specified.

Therefore, the CPU 201 adjusts (that is, increases or decreases) the mesh segmenting number so that the total mesh number that is computed falls within the tolerable range that is the target total mesh number M or less.

Next, a description will be given of the third function. The CPU 201 obtains and displays the maximum mesh length on the display unit by the first and second functions described above, in order to notify the value of the maximum mesh length to the operator. The third function creates the mesh within the CPU 201 based on the maximum mesh length that is obtained. The CPU 201 creates a node on a line segment of the mesh based on the maximum mesh length that is obtained, creates the mesh on a plane, creates a solid mesh in a space, and obtains the mesh number of each part 13 and the total mesh number of the entire circuit board assembly 10. In this example, the mesh (that is, element) may be generated by a known element generating technique, such as the advancing front technique, the mapping technique, and the like, that are element generating techniques based on the node.

When the total mesh number that is computed falls within the tolerable range that is the target total mesh number M or less, the CPU 201 outputs the mesh length and the mesh type of each part 13, the mesh, and the total mesh number that is computed thereby, and the process ends. The outputs of the CPU 201 may be displayed on the display unit, and may be used to automatically create the mesh.

Of course, the operator may specify the mesh length of some of the parts 13 or, all of the parts 13, from the input unit. When the mesh length of some of the parts 13 is specified, a mesh number M' may be obtained by subtracting the mesh number of the specified parts 13 from the target total mesh number M, in order to determine the mesh length of the remaining parts 13. The method of determining the mesh length in this case may be the same as that for the case in which the part 13 is not specified.

In the three-dimensional shape mode, some parts may interfere with each other. In this case, the operator may select from the input unit how an interfering portion is to be treated in the computer system 100. For example, the operator may select to create the mesh by ignoring the interfering portion or, to obtain the maximum mesh length without creating the mesh for the interfering parts, from the input unit.

Next, a more detailed description will be given of the processes described above, by referring to FIGS. 5 through 7. FIG. 5 is a flow chart for explaining an example of a mesh size determining process. The mesh size determining process illustrated in FIG. 5 corresponds to a part of the step S2 illustrated in FIG. 3, and realizes the first and second functions described above. FIGS. 6 and 7 are flow charts for explaining a part of the process of the step S2 illustrated in FIG. 3.

In FIG. 5, a step S21 accepts data related to the target total mesh number (or target total element number) M, the load position 15, the load (that is, magnitude of load), and the like. These data may be input from the input unit by the operator when the data of the three-dimensional surface model of the analyzing target, that is, the circuit board assembly 10, is input to the CPU 201. A step S22 computes the range 16 in which the amount of deflection is the predetermined amount or greater using a known computation formula, based on the data related to the load position 15 and the load, and the process advances to a step S24. In addition, a step S23 is executed in parallel to the step S22. The step S23 executes the process which will be described later in conjunction with FIG. 6, and the process advances to a step S25. The step S24 obtains the distance determined by the range 16 in which the amount of deflection is the predetermined amount or greater, the load position 15, and the center of gravity of each part 13 on the circuit board 12, determines the priority order for determining the maximum mesh length (or maximum element length) of the part 13 from the distance that is obtained, and assigns the priority from the part 13 having the shortest distance. For example, a value "1" is assigned as the priority to the part 13 having the highest priority. The priority assigned to the part 13 is stored in the storage unit together with the data of this part 13. The data of each part 13, including the priority, may be stored in a database formed by the storage unit. After the step S24, the step S25 decides whether the part 13 specified from the input unit by the operator is included in the analyzing target, that is, the circuit board assembly 10.

When the decision result in the step S25 is YES, a step S26 applies the mesh length (or element length) and the mesh type (or element type) that are specified from the input unit by the operator, with respect to the specified part 13. A step S27 computes the mesh number of the specified part 13 based on the specified mesh length. A step S28 obtains the mesh number M' by subtracting the mesh number of the specified part 13 from the target total mesh number M, and the process advances to a step S29.

When the decision result in the step S25 is NO or, after the step S28, a step S29 obtains the mesh length from the part 13 having the highest priority order, based on the data stored in the storage unit. In a case in which the maximum side length of the part 13 having the highest priority is segmented into 10 segments, the maximum mesh length may be determined by outputting the maximum mesh length for this case from the CPU 201. When the segmenting number of the maximum side length of the part 13 having the highest priority is regarded as having a ratio 1, coefficients such as 0.8, 0.7, . . . may be multiplied to the ratio as the priority of the parts 13 decreases, so that the segmenting number decreases and the meshes become more coarse for the parts 13 having lower priorities. In this example, each part 13 is segmented at least once, and the segmenting method may be specified from the input unit by the operator in order to make the segmenting at equal intervals or equal ratio intervals. A step S30 decides whether the number of unprocessed parts 13 for which the mesh length has not been obtained is zero ("0"), and the process returns to the step S29 when the decision result in the step S30 is NO.

When the decision result in the step S30 is YES, a step S31 computes the total mesh number based on the mesh length that is obtained. More particularly, the CPU 201 adds the priority described above, as the weight, to the mesh length, in order to compute the total mesh number. A step S32 decides whether the total mesh number that is computed falls within a tolerable range (for example, [M−20]%) that is the target total mesh number M or less. When the decision result in the step S32 is NO, the process returns to the step S29, in order to automatically increase the mesh number when the total mesh number is less than the tolerable range that is the target total mesh number M or less, and to automatically decrease the mesh number when the total mesh number exceeds the target total mesh number M. The method of increasing or decreasing the mesh number may be specified from the input unit by the operator, as described above.

On the other hand, when the decision result in the step S32 is YES, the process advances to a step S33. The step S33 determines and outputs the mesh length of each part 13. After the step S33, the process advances to steps S34 and S35. The steps S34 and S35 may be executed in parallel. The step S34 stores various kinds of data in the storage unit, including a model name (or device name) of the analyzing target, that is, the circuit board assembly 10, a part name of each part 13 included in the circuit board assembly 10, data related to each part 13, including the mesh length, and the like. Such various kinds of data may be stored in a database formed by the storage unit, together with data related to the log of mesh creation, for example. In addition, the step S35 executes the process which will be described later in conjunction with FIG. 7.

The step S23 executes the process of steps S41 through S48 illustrated in FIG. 6. The process illustrated in FIG. 6 corresponds to a part of the step S2 illustrated in FIG. 3, and realizes the second function described above.

In FIG. 6, when the process starts in the step S41, the step S42 approximates the analyzing target, that is, the circuit board assembly 10, by a three-dimensional mesh model, such as a parallelepiped, a cube, a cylinder, and the like, which includes the entire circuit board assembly 10, based on the CAD data that are input. The step S43 obtains the mesh length for a case in which the meshes are created by hexahedrons, for example, with respect to the shape of the circuit board assembly 10 that is approximated by the three-dimensional mesh model. The step S44 approximates each part 13 mounted on the circuit board 12 of the circuit board assembly 10 by a three-dimensional mesh model, such as a parallelepiped, a cube, a cylinder, and the like, in a manner similar to the circuit board assembly 10, based on the mesh length of the entire circuit board assembly 10, and obtains the mesh number for a case in which the meshes of the parts 13 are created by hexahedrons, for example. Further, the step S44 compares the volume of hexahedron meshes of the entire circuit board assembly 10 and the volume of each part 13, and obtains the approximate mesh number, that is, the predicted total mesh number of the entire circuit board assembly 10, from a ratio of the volumes. The step S45 obtains the maximum side length of each part 13. The step S46 decides whether the mesh length obtained for the circuit board assembly 10 is shorter than the maximum side length of each part 13. When the decision result in the step S46 is NO, the step S47 sets ½ the maximum side length of the part 13 having the maximum side length shorter than the mesh length obtained for the circuit board assembly 10, as the mesh length of the circuit board assembly 10, and the process advances to the step S48. On the other hand, when the decision result in the step S46 is YES, the process advances to the step S48. The step S48 advances to the process of the step S25 illustrated in FIG. 4.

The step S35 illustrated in FIG. 5 executes the process of steps S51 through S56 illustrated in FIG. 7. The process illustrated in FIG. 7 corresponds to a part of the step S2 illustrated in FIG. 3, and realizes the third function described above.

In FIG. 7, when the process starts in the step S51, the step S52 decides whether the meshes of the analyzing target, that is, the circuit board assembly 10, are to be generated within the CPU 201 of the computer system 100. When the decision result in the step S52 is YES, the step S53 creates the node on the line segment of the mesh of each part 13, based on the maximum mesh length that is obtained by the mesh size determining process illustrated in FIG. 5. The step S54 creates the mesh on the plane based on the node that is created, using the known element generating technique, and creates the solid mesh in the space. The step S55 obtains the mesh number of each part 13 and the total mesh number of the entire circuit board assembly 10, based on the mesh that is created based on the node, and the process advances to the step S56.

When the decision result in the step S52 is NO or, after the step S55, the step S56 stores various kinds of data in the storage unit, including the model name (or device name) of the analyzing target, that is, the circuit board assembly 10, the part name of each part 13 included in the circuit board assembly 10, the data related to each part 13, including the mesh length, and the like, because the total mesh number that is computed falls within the tolerable range that is the target total mesh number M or less. Such various kinds of data may be stored in the database formed by the storage unit, together with the data related to the log of mesh creation, for example. Such outputs of the CPU 201 may be displayed on the display unit.

When predicting the mesh number in the step S2 illustrated in FIG. 3 or, when generating the input data for the numerical analysis in the step S8 according to the known method, the CPU 201 may make an access to the total mesh number, a node number (or number of nodes), and the like stored in the database formed by the storage unit, in order to predict an analyzing time of the three-dimensional mesh model using a known analyzing time prediction algorithm, and notify the predicted analyzing time to the operator by displaying the predicted analyzing time on the display unit, for example.

In this embodiment, the three-dimensional mesh model is created from the three-dimensional surface model based on the predicted total mesh number in order to confirm the total mesh number of the three-dimensional mesh model. For this reason, it may be possible reduce a re-do process, such as manually creating the meshes over again by the operator in order to adjust the total mesh number after the meshes are created. The analyzing time may be predicted even with respect to the analyzing target for which the three-dimensional mesh model is created for the first time, when the operator simply inputs the target total mesh number to the computer system.

[Second Embodiment]

Next, a description will be given of an example of the mesh number predicting method, the analyzing apparatus, and the non-transitory computer-readable storage medium in a second embodiment of the present invention. In this embodiment, the mesh number prediction method may cause a computer to execute procedures of a program in order to make the computer function as units or means of the analyzing apparatus. Alternatively, the program which, when executed by the computer, causes the computer to perform a process in order to make the computer realize functions of the analyzing apparatus, may be stored in the non-transitory computer-readable storage medium. In this example, it is assumed for the sake of convenience that the mesh number prediction method is applied to a CAE system which numerically simulates characteristics or physical phenomena of the analyzing target, such as a circuit board assembly mounted with a plurality of parts, by numerical analysis.

The structure of the computer system in this second embodiment may be the same as the structure illustrated in FIGS. 1 and 2, and thus, an illustration and description thereof will be omitted. In addition, the analyzing process in this second embodiment may basically include steps similar to the steps S1 through S12 illustrated in FIG. 3, and thus, an illustration and description thereof will be omitted. As will be described later, a part of the process of the step S1 or the step S2 in this second embodiment is different from that of the first embodiment described above, and the accuracy of the mesh number prediction may be improved by a learning function and the analyzing time may be shortened.

Figure 8:
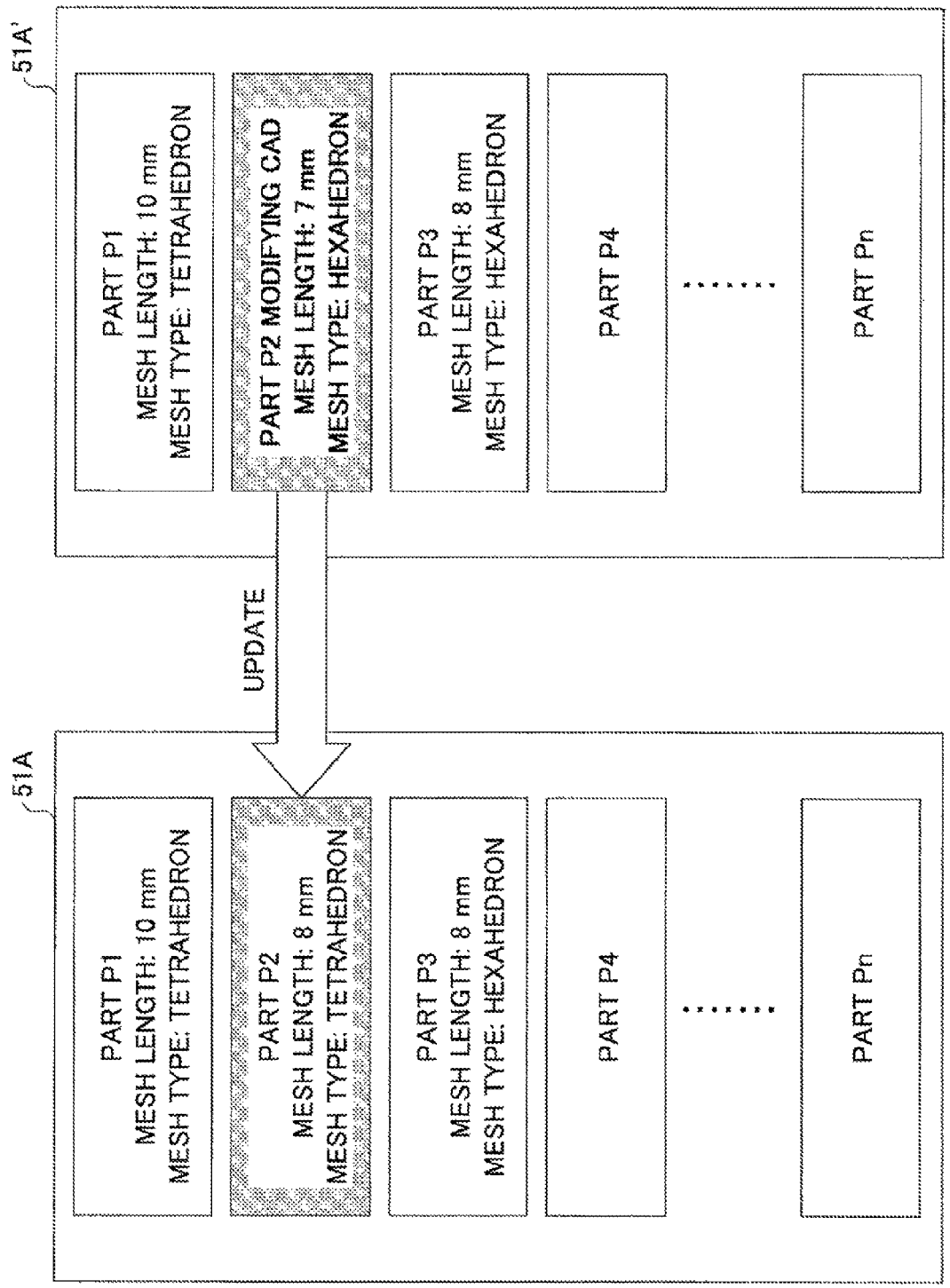
FIG. 8 is a diagram for explaining updating of a database in a second embodiment of the present invention.

FIG. 8 is a diagram for explaining updating of a database in this second embodiment of the present invention. As an example, FIG. 8 illustrates data 51A related to a three-dimensional mesh model A of the analyzing target within the database, and data 51A' related to a three-dimensional mesh model A' of the analyzing target within the database. The data 51A include data related to parts P1 through Pn of the three-dimensional mesh model A, and the data 51A' include data related to parts P1 through Pn of the three-dimensional mesh model A'. In this example, it is assumed for the sake of convenience that the data related to each part Pi (i 1, . . . , n) include the mesh length and the mesh type of the three-dimensional mesh model of the part Pi.

The computer system 100 creates the mesh in the process of the step S3, based on the maximum mesh length of the mesh of each part of the three-dimensional mesh model A of the analyzing target obtained in the process of the step S2 illustrated in FIG. 3. In this process of creating the mesh, a modification, such as a further mesh segmenting, erasure of a line segment, and the like, may be made at the operator's convenience. As a result of the further mesh segmenting based on an instruction input from the input unit by the operator, the part P2 created as a tetrahedron mesh type may be modified to the part P2' of the hexahedron mesh type, for example.

Accordingly, the operator may make the modification, such as the further mesh segmenting, the erasure of a surplus line segment, and the like while referring to the mesh length that is output from the computer system 100, in order to create the three-dimensional mesh model A' with the meshes that are created to have an improved mesh quality compared to that of the three-dimensional mesh model A. The operator may input an update instruction from the input unit after creating the three-dimensional mesh model A' in order to instruct updating to the three-dimensional mesh model A' or, also input the data of the three-dimensional mesh model A' when inputting the CAD data to the computer system 100 in order to instruct the updating to the three-dimensional mesh model A'.

The computer system 100 reads the data of the part of the analyzing target from the database, based on the model name (or device name) of the analyzing target included in the data of the three-dimensional mesh model A' that are input, and searches for the part having a matching part name from the CAD data input by the operator. The mesh length and the mesh type are compared using the mesh data that are input, and the database is updated by the data of the three-dimensional mesh model A' when they are different from the mesh length and the mesh type stored in the database. The data before the updating may be registered in the database as the data related to a log.

Figure 9:
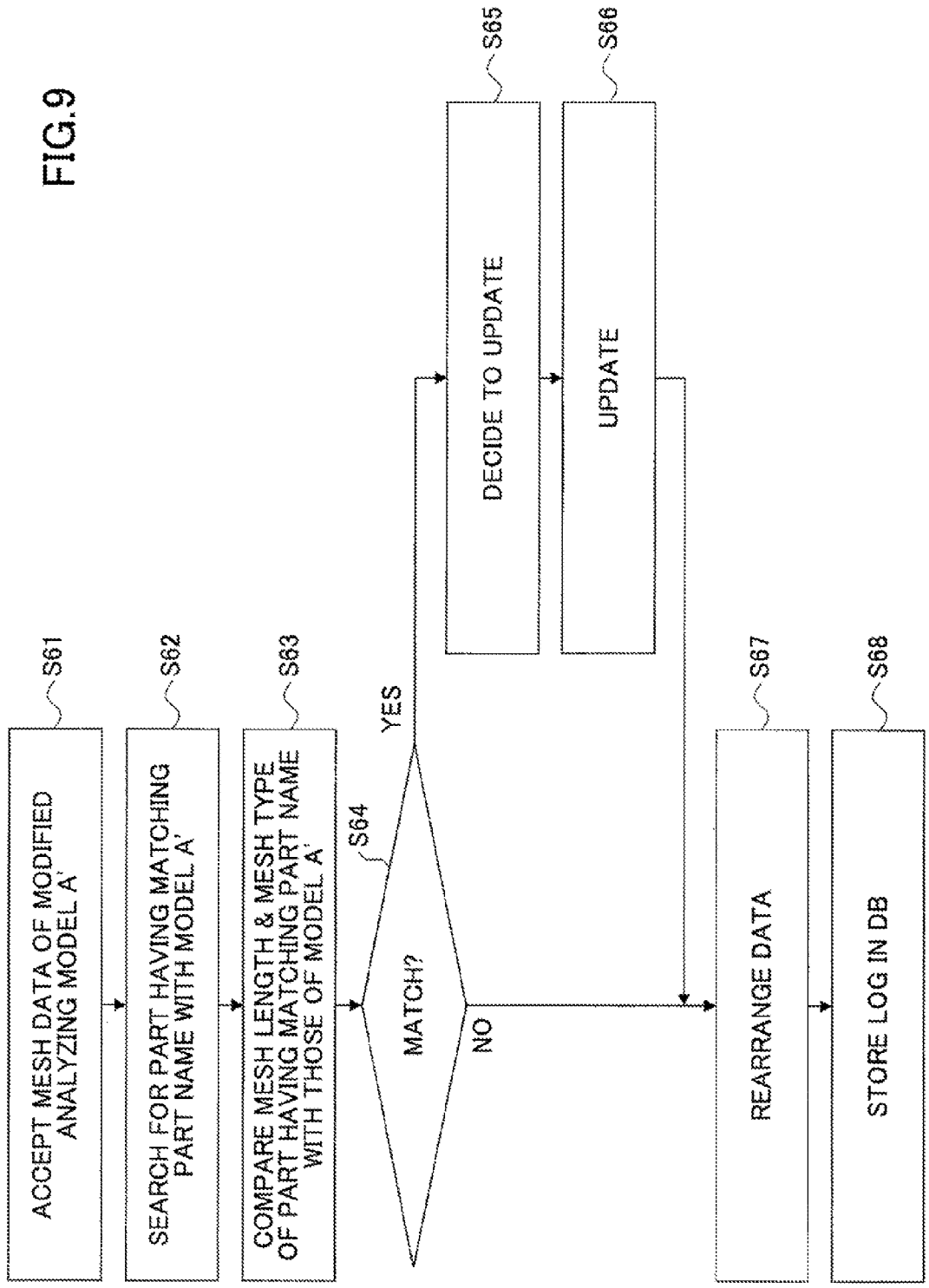
FIG. 9 is a flow chart for explaining an example of a database updating process.

FIG. 9 is a flow chart for explaining an example of a database updating process. The database updating process illustrated in FIG. 9 is included in the process of the step S1 illustrated in FIG. 3, for example, and may realize a learning function.

In FIG. 9, a step S61 accepts the CAD data of the analyzing target and the mesh data of the modified three-dimensional mesh model A'. A step S62 refers to the database formed by the storage unit, and searches for a part having a matching part name with the three-dimensional mesh model A'. A step S63 compares the mesh length and the mesh type of the part stored in the database and having the matching part name with the three-dimensional mesh model A', and the mesh length and the mesh type of the part of the three-dimensional mesh model A'. A step S64 decides whether the compared mesh lengths and the compared mesh types match, respectively.

When the decision result in the step S64 is YES, a step S65 decides to update the mesh data, such as the mesh length, the mesh type, and the like of the part (or found part) that is found as a result of the search and stored in the database, by the mesh data of the three-dimensional mesh model A'. A step S66 updates the mesh data of the found part stored in the database by the mesh data of the three-dimensional mesh data A'. In the example illustrated in FIG. 8, the mesh data of the part P2 of the three-dimensional mesh model A are updated by the mesh data of the part P2' of the three-dimensional mesh model A'.

When the decision result in the step S64 is NO or, after the step S66, a step S67 rearranges the data, including the model name (or device name) of the analyzing target, the data related to the part, the total mesh number, and the like within the database. A step S68 stores data related to a log of mesh updating, so that the data related to the log of the mesh updating may be displayed on the display unit a next time the access is made to the database, and the process ends.

Next, a description will be given of a method of determining the mesh length of the part using feedback information of the updating process. The method of determining the mesh length of a new analyzing target based on the information updated by the learning function, that is, the feedback information of the updating process, may include the following procedures.

First, with respect to a three-dimensional mesh model B of the analyzing target that is input, a search is made to find a part with a matching part name from the database. With respect to the parts with the matching part name, the priorities of the mesh length allocation, that is, the priorities of the maximum mesh length determination, are further compared. When the compared priorities match, the mesh length and the mesh type are allocated based on the data in the database and displayed on the display unit. On the other hand, when the compared priorities do not match, the mesh length in the database is made longer by multiplying a constant and then allocated to the input part, when the priority of the database is higher than the priority of the input part. Further, the mesh length in the database is made shorter by dividing by a constant and then allocated to the input part, when the priority of the database is lower than the priority of the input part.

When a portion of the part name of the input part matches that in the database, it may be regarded that the parts are similar when an error in the maximum side lengths, the volumes, and cross sectional shapes are 10% or less, for example, as a result of comparing the maximum side lengths, the vertex numbers, the line segment numbers, the volumes, the cross sectional shapes, and the like of the parts. The operator may input a similarity judging standard (or condition), such as an error of 0 to 100%, from the input unit. The output results of the computer system 100 may include the mesh length and the mesh type of the part within the database that is judged as being the similar part (that is, a part similar to the input part).

Figure 10:
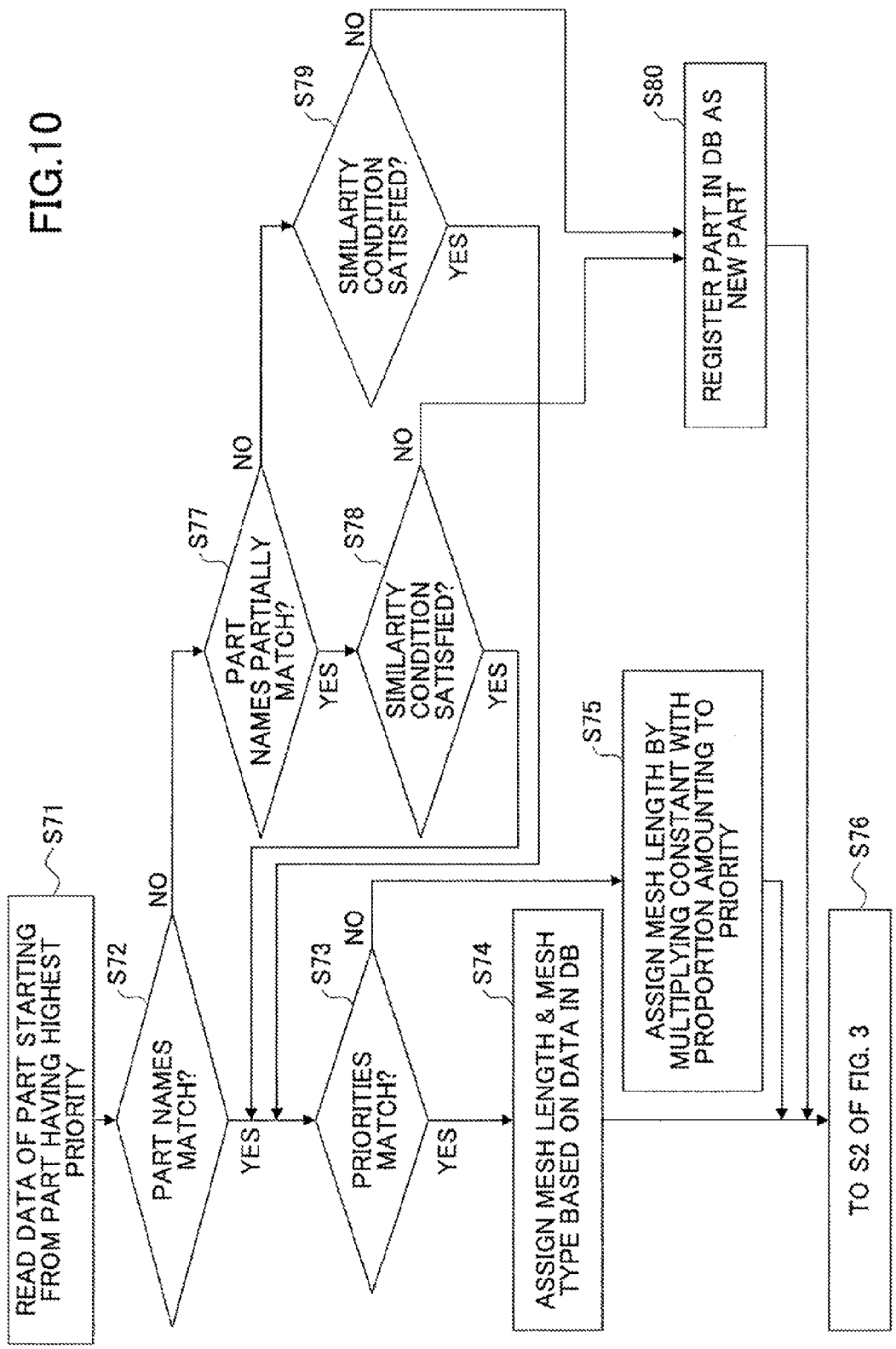
FIG. 10 is a flow chart for explaining an example of a mesh length determining process using feedback information.

FIG. 10 is a flow chart for explaining an example of a mesh length determining process using the feedback information. The mesh length determining process illustrated in FIG. 10 may be included in the process of the step S2 illustrated in FIG. 3, for example.

In FIG. 10, a step S71 refers to the database for the three-dimensional mesh model B of the analyzing target, and reads the data of the parts in an order starting from the part that is assigned the highest priority. A step S72 decides whether the data of the part having a part name matching that of the part of the three-dimensional mesh model B are read. When the decision result in the step S72 is YES, a step S73 decides whether the data of the part having a priority matching that of the part of the three-dimensional mesh model B are read. When the decision result in the step S73 is YES, a step S74 assigns the mesh length and the mesh type of the three-dimensional mesh model B, based on the data stored in the database, and displays the mesh segmenting number on the display unit, for example, when the mesh segmenting number is included in the data stored in the database. On the other hand, when the decision result in the step S73 is NO, a step S75 assigns a mesh length that is obtained by multiplying by a constant with a proportion amounting to the priority to the mesh length, based on the data stored in the database. The process advances to a step S76 after the step S74 or the step S75. The step S76 returns the process to the step S2 illustrated in FIG. 3, and the process advances to the step S21 illustrated in FIG. 5, for example.

When the decision result in the step S72 is NO, a step S77 decides whether the data of the part having a part name matching a portion of the part name the part of the three-dimensional mesh model B, that is, the data of the part having the part name partially matching that of the part of the three-dimensional mesh model B, are read. When the decision result in the step S77 is YES, a step S78 decides whether the data of the part satisfying a similarity condition with respect to the part of the three-dimensional mesh model B are read. For example, the similarity condition used in the step S78 regards the part whose data are read from the database as having a shape similar to the part of the three-dimensional mesh model B when an error in the maximum side lengths, the volumes, and cross sectional shapes are 10% or less, as a result of comparing the maximum side lengths, the vertex numbers, the line segment numbers, the volumes, the cross sectional shapes, and the like of the parts. The operator may input the similarity judging standard (or condition), such as an error of 0 to 100%, from the input unit. When the decision result in the step S78 is YES, the process returns to the step S73.

When the decision result in the step S77 is NO, a step S79 decides whether the data of the part satisfying the similarity condition with respect to the part of the three-dimensional mesh model B are read. The similarity condition used in the step S79 may be similar to the similarity condition used in the step S78 described above. When the decision result in the step S79 is YES, the process returns to the step S73. On the other hand, when the decision result in the step S78 is NO or, when the decision result in the step S79 is NO, the process advances to a step S80. The step S80 stores (or registers) the part satisfying the similarity condition with respect to the part of the three-dimensional mesh model B in the database as a new part, and determines the segmenting number of the maximum side length of the new part based on the priority. After the step S80, the process advances to the step S76.

Figure 11A:
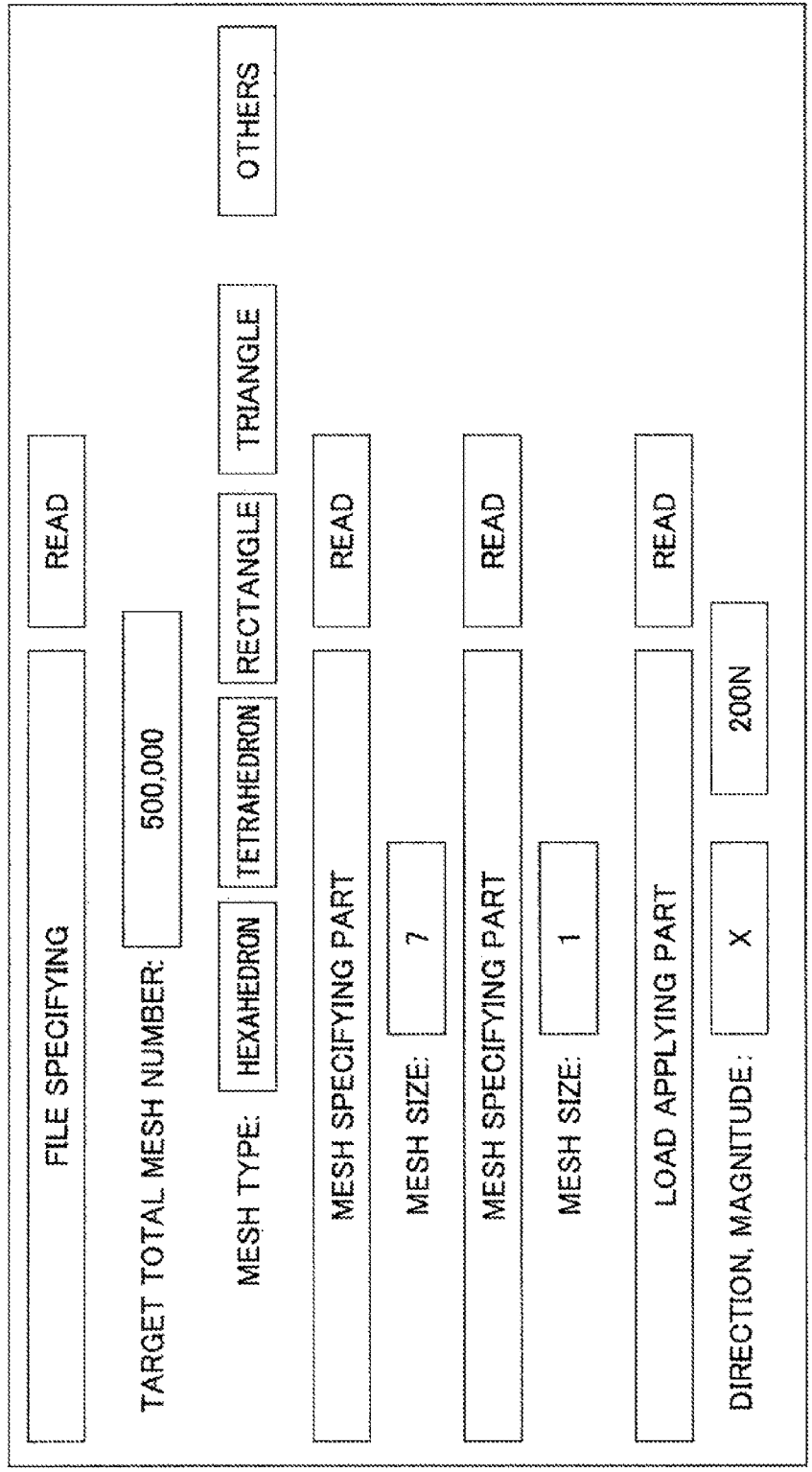
Figure 11C:
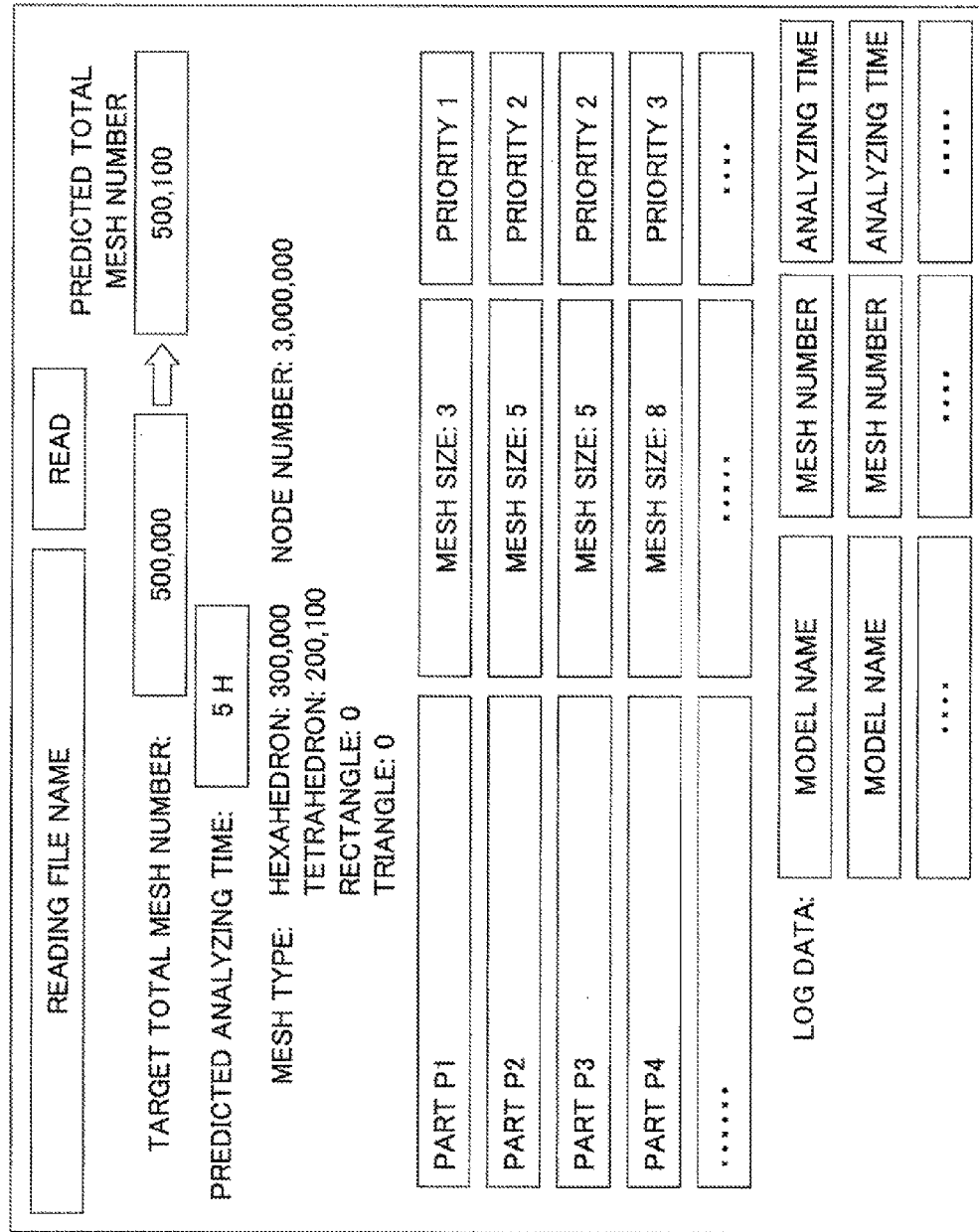

FIGS. 11A, 11B and 11C are diagrams for explaining examples of a display screen displayed on the display. FIG. 11A illustrates an example of the input screen that is used to input the data related to the target total mesh number M, the load position 15, and the load (that is, the magnitude of the load) in the step S21 illustrated in FIG. 5. FIG. 11B illustrates an example of the input screen that is used to input the CAD data of the analyzing target and the mesh data of the modified three-dimensional mesh model A' in the step S61 illustrated in FIG. 9. FIG. 11C illustrates an example of an output screen that is used to output the data including the predicted total mesh number in the step S2 illustrated in FIG. 3.

When specifying information is input from the input unit to fields such as "file specifying", "mesh specifying part", "load applying part", and the like and a "read" button is selected on the input screen illustrated in FIG. 11A, the specifying information input to these fields are confirmed, and the file of the analyzing target, the part of the analyzing target for which the mesh number is to be predicted, and the part of the analyzing target to which the load is to be applied are specified. In this example, the target total mesh number M is set to 500,000, the mesh type may be set to "hexahedron", "tetrahedron", "rectangle", "triangle", and "others". The mesh size (arbitrary units), that is, the mesh length, may be set with respect to the mesh specifying part for which the mesh number is to be predicted. In addition, the direction (X direction in this example) in which the load is applied, and the magnitude of the load (200N in this example) may be specified with respect to the load applying part that is the target to which the load is applied.

When the specifying information is input from the input unit to "analyzing file specifying" and "modifying file specifying" fields and a "read" button is selected on the input screen illustrated in FIG. 11B, the specifying information input to these fields are confirmed. In this example, the file of the mesh data of the three-dimensional mesh model A of the analyzing target is specified by the analyzing file specifying, and the file of the mesh data of the modified three-dimensional mesh model A' is specified by the modifying file specifying. For example, when the mesh data of the modified three-dimensional mesh model A' are fed back and updated in the database, and the predicted analyzing times are different for the case in which the modified three-dimensional mesh model A' is thereafter analyzed and the case in which the three-dimensional mesh model A is analyzed, the predicted analyzing time of the modified three-dimensional mesh model A' is displayed in an "analyzing time" field.

When specifying information of the file of the analyzing target to be read from the database is input from the input unit to a "reading file name" field and a "read" button is selected on the output screen illustrated in FIG. 11C, the predicted total mesh number (500,100 in this example) that is predicted from the target total mesh number (500,000 in this example) in the step S2 illustrated in FIG. 3 is displayed. In this example, the predicted analyzing time (5 hours (H) in this example), the mesh type, and the like of the analyzing target are also displayed. Further, the mesh size (or mesh length) and the priority of each of the parts P1, P2, . . . are also displayed. The data related to the log may include the model name, the mesh number, the predicted analyzing time, and the like of the analyzing target stored in the database. Hence, when the data related to the log are displayed, the data related to the log of the mesh creation may easily be utilized efficiently.

In the step S2 illustrated in FIG. 2, the CPU 201 may make an access to the data related to the load of the mesh creation and the like that are stored the database formed by the storage unit, in order to read the mesh number and the mesh segmenting number of the part that is the same or the part that has a similar shape, based on the data related to the log of the mesh creation. The mesh number and the mesh segmenting number that are read from the storage may be utilized efficiently, in order to more efficiently predict the mesh number.

This second embodiment may obtain effects similar to those obtainable by the first embodiment described above. In addition, this second embodiment may update the contents of the database in the computer system by rereading the parts modified by the operator, in order to improve the prediction accuracy of the mesh number and the analyzing time of each part.

In each of the embodiments described above, it is assumed for the sake of convenience that the load is applied to one part. However, when there is no part applied with the load, the predicted total mesh number may of course be obtained by inputting the target total mesh number M and the analyzing target position to the computer system. In addition, the analysis of the analyzing target is not limited to the analysis of the mechanical characteristic of the analyzing target, such as the load, and the analysis of the analyzing target may include the analysis of the electrical characteristics, the thermal characteristics and the like of the analyzing target. Moreover, the analysis of the analyzing target may include the analysis of an arbitrary combination of the mechanical characteristics, the electrical characteristics, the thermal characteristics, and the like.

In the embodiments described above the database is formed by the storage unit of the computer system. However, the database may of course be formed by an external storage unit that is accessible from the computer system, such as a storage unit that is externally connected to the computer system via a network or the like.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A mesh number prediction method to predict a mesh number by a computer, comprising:
   obtaining, by the computer, a mesh length for a case in which a mesh having an arbitrary shape is created by approximating an analyzing target by a three-dimensional mesh model that includes the analyzing target in its entirety, based on data of a three-dimensional surface model of the analyzing target, to store the mesh length in a storage unit;
   obtaining, by the computer, a mesh number of each of parts forming the analyzing target for a case in which a mesh having an arbitrary shape is created by approximating each of the parts by a three-dimensional mesh model, based on the mesh length, to store the mesh number of each of the parts in the storage unit; and
   obtaining, by the computer, a predicted total mesh number of the analyzing target in its entirety, based on the mesh number of each of the parts, and a ratio of volumes that are obtained by comparing a volume of the analyzing target in its entirety and a volume of each of the parts, to store the predicted total mesh number in the storage unit.

2. The mesh number prediction method as claimed in claim 1, further comprising:
   setting, by the computer, the mesh length of the analyzing target to ½ a maximum side length of a predetermined part when the mesh length obtained for the analyzing target is longer than the maximum side length of the predetermined part.

3. The mesh number prediction method as claimed in claim 2, wherein the setting improves the mesh length and recomputes the mesh number of each of the parts based on input information when a total mesh number amounting to a total of mesh numbers of each of the parts exceeds the target total mesh number, and confirms the mesh length of each of the parts obtained when the total mesh number is within a tolerable range that is the target total mesh number or less.

4. The mesh number prediction method as claimed in claim 1, further comprising:
   determining, by the computer, a priority of a maximum mesh length using a load position or a magnitude of a load with respect to the analyzing target as a weight.

5. The mesh number prediction method as claimed in claim 4, wherein the determining performs a fine mesh segmenting with respect to a part located at a position that is less than a predetermined distance from the load position, and performs a coarse mesh segmenting with respect to a part located at a position that is the predetermined distance or greater from the load position.

6. The mesh number prediction method as claimed in claim 1, further comprising:
   generating, by the computer, meshes based on a total mesh number of the analyzing target, by creating nodes on a line segment of a mesh, creating a mesh on a plane, creating a solid mesh in a space, and obtaining mesh numbers of each of the parts and the total mesh number, based on the predicted total mesh length.

7. The mesh number prediction method as claimed in claim 1, further comprising:
   updating, by the computer, data of the parts stored in the storage unit, including the mesh length and the mesh numbers of each of the parts, to store data related to a log of mesh creation; and
   reading, by the computer, the mesh number and a mesh segmenting number of a part that is identical or has a similar shape to the part of the analyzing target from the storage unit based on the data related to the log of the mesh creation, in order to make the mesh number and the mesh segmenting number read from the storage unit usable by the obtaining the predicted total mesh number.

8. An analyzing apparatus comprising:
a processor; and
a storage unit coupled to the processor,
wherein the processor performs a process including
obtaining a mesh length for a case in which a mesh having an arbitrary shape is created by approximating an analyzing target by a three-dimensional mesh model that includes the analyzing target in its entirety, based on data of a three-dimensional surface model of the analyzing target, to store the mesh length in the storage unit;
obtaining a mesh number of each of parts forming the analyzing target for a case in which a mesh having an arbitrary shape is created by approximating each of the parts by a three-dimensional mesh model, based on the mesh length, to store the mesh number of each of the parts in the storage unit;
obtaining a predicted total mesh number of the analyzing target in its entirety, based on the mesh number of each of the parts, and a ratio of volumes that are obtained by comparing a volume of the analyzing target in its entirety and a volume of each of the parts, to store the predicted total mesh number in the storage unit; and
analyzing the analyzing target using meshes created based on the predicted total mesh number.

9. The analyzing apparatus as claimed in claim 8, wherein the processor performs the process further including
setting the mesh length of the analyzing target to ½ a maximum side length of a predetermined part when the mesh length obtained for the analyzing target is longer than the maximum side length of the predetermined part.

10. The analyzing apparatus as claimed in claim 9, wherein the setting improves the mesh length and recomputes the mesh number of each of the parts based on input information when a total mesh number amounting to a total of mesh numbers of each of the parts exceeds the target total mesh number, and confirms the mesh length of each of the parts obtained when the total mesh number is within a tolerable range that is the target total mesh number or less.

11. The analyzing apparatus as claimed in claim 8, wherein the processor performs the process further including determining a priority of a maximum mesh length using a load position or a magnitude of a load with respect to the analyzing target as a weight.

12. The analyzing apparatus as claimed in claim 8, wherein the analyzing analyzes one of or, an arbitrary combination of, mechanical characteristics of the analyzing target, electrical characteristics of the analyzing target, and thermal characteristics of the analyzing target.

13. A non-transitory computer-readable storage medium having stored therein a program for causing a computer to execute a process comprising:
obtaining a mesh length for a case in which a mesh having an arbitrary shape is created by approximating an analyzing target by a three-dimensional mesh model that includes the analyzing target in its entirety, based on data of a three-dimensional surface model of the analyzing target, to store the mesh length in a storage unit;
obtaining a mesh number of each of parts forming the analyzing target for a case in which a mesh having an arbitrary shape is created by approximating each of the parts by a three-dimensional mesh model, based on the mesh length, to store the mesh number of each of the parts in the storage unit; and
obtaining a predicted total mesh number of the analyzing target in its entirety, based on the mesh number of each of the parts, and a ratio of volumes that are obtained by comparing a volume of the analyzing target in its entirety and a volume of each of the parts, to store the predicted total mesh number in the storage unit.

14. The non-transitory computer-readable storage medium as claimed in claim 1, wherein the program causes the computer to execute the process further comprising:
setting the mesh length of the analyzing target to ½ a maximum side length of a predetermined part when the mesh length obtained for the analyzing target is longer than the maximum side length of the predetermined part.

15. The non-transitory computer-readable storage medium as claimed in claim 14, wherein the setting improves the mesh length and recomputes the mesh number of each of the parts based on input information when a total mesh number amounting to a total of mesh numbers of each of the parts exceeds the target total mesh number, and confirms the mesh length of each of the parts obtained when the total mesh number is within a tolerable range that is the target total mesh number or less.

16. The non-transitory computer-readable storage medium as claimed in claim 13, wherein the program causes the computer to execute the process further comprising:
determining determine a priority of a maximum mesh length using a load position or a magnitude of a load with respect to the analyzing target as a weight.

17. The non-transitory computer-readable storage medium as claimed in claim 16, wherein the determining performs a fine mesh segmenting with respect to a part located at a position that is less than a predetermined distance from the load position, and performs a coarse mesh segmenting with respect to a part located at a position that is the predetermined distance or greater from the load position.

18. The non-transitory computer-readable storage medium as claimed in claim 13, wherein the program causes the computer to execute the process further comprising:
generating meshes based on a total mesh number of the analyzing target, by creating nodes on a line segment of a mesh, creating a mesh on a plane, creating a solid mesh in a space, and obtaining mesh numbers of each of the parts and the total mesh number, based on the predicted total mesh length.

19. The non-transitory computer-readable storage medium as claimed in claim 13, wherein the program causes the computer to execute the process further comprising:
updating data of the parts stored in the storage unit, including the mesh length and the mesh numbers of each of the parts, and store data related to a log of mesh creation; and
reading the mesh number and a mesh segmenting number of a part that is identical or has a similar shape to the part of the analyzing target from the storage unit based on the data related to the log of the mesh creation, in order to make the mesh number and the mesh segmenting number read from the storage unit usable by the obtaining the predicted total mesh number.

20. The non-transitory computer-readable storage medium as claimed in claim 13, wherein the program causes the computer to execute the process further comprising:
storing in the storage unit, together with the predicted total mesh number, a mesh length and a mesh type of each of the parts, the meshes, and a total mesh number obtained by totaling the mesh numbers of each of the parts.

\* \* \* \* \*